US007188297B2

(12) United States Patent
Blankenship et al.

(10) Patent No.: US 7,188,297 B2
(45) Date of Patent: Mar. 6, 2007

(54) METHOD AND APPARATUS FOR ENCODING AND DECODING DATA

(75) Inventors: Yufei W. Blankenship, Streamwood, IL (US); T. Keith Blankenship, Streamwood, IL (US)

(73) Assignee: Motorola, Inc., Schaumburg, IL (US)

( * ) Notice: Subject to any disclaimer, the term of this patent is extended or adjusted under 35 U.S.C. 154(b) by 244 days.

(21) Appl. No.: 11/078,817

(22) Filed: Mar. 11, 2005

(65) Prior Publication Data

US 2006/0036932 A1 Feb. 16, 2006

Related U.S. Application Data

(63) Continuation-in-part of application No. 11/070,129, filed on Mar. 1, 2005.

(60) Provisional application No. 60/600,953, filed on Aug. 12, 2004.

(51) Int. Cl.
*H03M 13/00* (2006.01)
(52) U.S. Cl. ...................... 714/758; 714/804
(58) Field of Classification Search ............ 714/758, 714/804
See application file for complete search history.

(56) References Cited

U.S. PATENT DOCUMENTS 6,633,856 B2 * 10/2003 Richardson et al. .......... 706/15
6,789,227 B2 * 9/2004 De Souza et al. .......... 714/804
6,895,547 B2 * 5/2005 Eleftheriou et al. ........ 714/801

OTHER PUBLICATIONS

Lu et. al., Partition-and-Shift LDPC Codes, IEEE, vol. 41 No. 10, pp. 2977-2979.*
Zhong et. al., Design of VLSI Implementation-Oriented LDPC Codes, Rensselaer Polytechnic Institute.*
Echard, The Pi-Rotation Low-Density Parity Check Codes, IEEE, pp. 980-984.*
Hocevar, Dale E.: LDPC Code Construction with Flexible Hardware Implementation, 2003 IEEE Int. Conf. Commun. (ICC 2003), vol. 4, pp. 2708-2712.
Joo, Panyuh et al.: BLDPC coding for OFDMA PHY, IEEE 802.16 Broadband Wireless Access Working Group <http://ieee802.org/16>, IEEE 802.16.Xc-01/NNr0, Apr. 24, 2004, pp. 0-10.

* cited by examiner

*Primary Examiner*—Albert Decady
*Assistant Examiner*—Mujtaba K. Chaudry (57) ABSTRACT

A base model matrix is defined for the largest code length of each code rate. The set of shifts $\{p(i,j)\}$ in the base model matrix are used to determine the shift sizes for all other code lengths of the same code rate. Shift sizes $\{p(f,i,j)\}$ for a code size corresponding to expansion factor $z_f$ are derived from $\{p(i,j)\}$ by scaling $p(i,j)$ proportionally, and a model matrix defined by $\{p(f,i,j)\}$ is used to determine the parity-check bits for the f-th code.

18 Claims, 2 Drawing Sheets

METHOD AND APPARATUS FOR ENCODING AND DECODING DATA

FIELD OF THE INVENTION

The present invention relates generally to encoding and decoding data and in particular, to a method and apparatus for encoding and decoding data utilizing low-density parity-check (LDPC) codes.

BACKGROUND OF THE INVENTION

A low-density parity-check (LDPC) code is a linear block code specified by a parity-check matrix H. In general, an LDPC code is defined over a Galois Field GF(q), $q \geq 2$. If $q=2$, the code is a binary code. All linear block codes can be described as the product of a k-bit information vector $s_{1 \times k}$ with a code generator matrix $G_{k \times n}$ to produce an n-bit codeword $x_{1 \times n}$, where the code rate is $r=k/n$. The codeword x is transmitted through a noisy channel, and the received signal vector y is passed to the decoder to estimate the information vector $s_{1 \times k}$.

Given an n-dimensional space, the rows of G span the k-dimensional codeword subspace C, and the rows of the parity-check matrix $H_{m \times n}$ span the m-dimensional dual space $C^{\perp}$, where $m=n-k$. Since $x=sG$ and $GH^T=0$, it follows that $xH^T=0$ for all codewords in subspace C, where "T" (or "T") denotes matrix transpose. In the discussion of LDPC codes, this is generally written as $$HX^T = 0^T, \quad (1)$$

where 0 is a row vector of all zeros, and the codeword $x = [s\ p] = [s_0, s_1, \ldots, s_{k-1}, p_0, p_1, \ldots, p_{m-1}]$, where $p_0, \ldots, p_{m-1}$ are the parity-check bits and $s_0, \ldots, s_{k-1}$ are the systematic bits, equal to the information bits within the information block.

For an LDPC code the density of non-zero entries in H is low, i.e., there are only a small percentage of 1's in H, allowing better error-correcting performance and simpler decoding than using a dense H. A parity-check matrix can be also described by a bipartite graph. The bipartite graph is not only a graphic description of the code but also a model for the decoder. In the bipartite graph, a codeword bit (therefore each column of H) is represented by a variable node on the left, and each parity-check equation (therefore each row of H) is represented by a check node on the right. Each variable node corresponds to a column of H and each check node corresponds to a row of H, with "variable node" and "column" of H referred to interchangeably, as are "check node" and "row" of H. The variable nodes are only connected to check nodes, and the check nodes are only connected to variable nodes. For a code with n codeword bits and m parity bits, variable node $v_j$ is connected to check node $c_i$ by an edge if codeword bit j participates in check equation i, $i=0, 1, \ldots, m-1, j=0, 1, \ldots, n-1$. In other words, variable node j is connected to check node i if entry $h_{ij}$ of the parity-check matrix H is 1. Mirroring Equation (1), the variable nodes represent a valid codeword if all check nodes have even parity.

An example is shown below to illustrate the relationship between the parity-check matrix, the parity-check equations, and the bipartite graph. Let an $n=12$, rate-½ code be defined by $$H = \begin{bmatrix} 1 & 0 & 1 & 0 & 0 & 0 & | & 1 & 1 & 0 & 0 & 0 & 0 \\ 0 & 1 & 0 & 0 & 1 & 0 & | & 0 & 1 & 1 & 0 & 0 & 0 \\ 0 & 0 & 1 & 0 & 0 & 1 & | & 1 & 0 & 1 & 1 & 0 & 0 \\ 1 & 0 & 0 & 1 & 0 & 0 & | & 0 & 0 & 0 & 1 & 1 & 0 \\ 0 & 1 & 0 & 0 & 1 & 0 & | & 0 & 0 & 0 & 0 & 1 & 1 \\ 0 & 0 & 0 & 1 & 0 & 1 & | & 1 & 0 & 0 & 0 & 0 & 1 \end{bmatrix} \} m, \quad (2)$$

with the left side portion corresponding to k (=6) information bits s, the right side portion corresponding to m (=6) parity bits p. Applying (1), the H in (2) defines 6 parity-check equations as follows:

$$\begin{cases} x_0 + x_2 + x_6 + x_7 = 0 \\ x_1 + x_4 + x_7 + x_8 = 0 \\ x_2 + x_5 + x_6 + x_8 + x_9 = 0 \\ x_0 + x_3 + x_9 + x_{10} = 0 \\ x_1 + x_4 + x_{10} + x_{11} = 0 \\ x_3 + x_5 + x_6 + x_{11} = 0 \end{cases} \quad (3)$$

Figure 1:
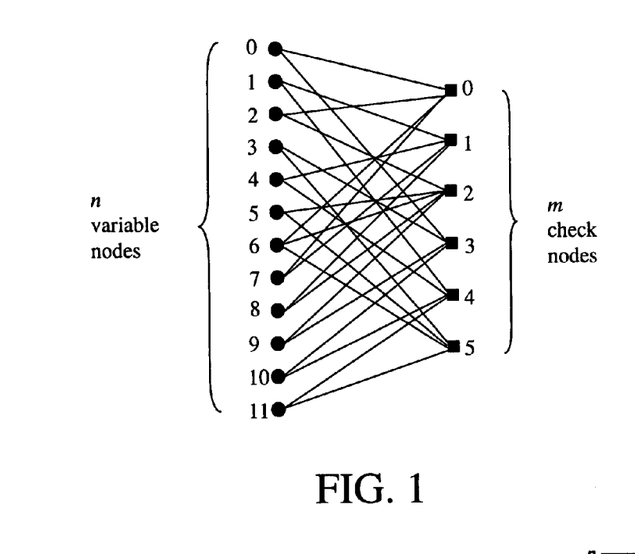
FIG. 1 illustrates the bipartite graph of an (12, 6) H matrix.

H also has the corresponding bipartite graph shown in FIG. 1.

A bipartite graph of a good finite length LDPC code inevitably has cycles. A cycle of length 2d (denoted as cycle-2d) is a path of 2d edges which passes through d variable nodes and d check nodes and connects each node to itself without repeating any edge. Short cycles, especially cycle-4, degrade the performance of an iterative decoder and are normally avoided in the code design.

When the code size becomes large, it is difficult to encode and decode a randomly constructed LDPC code. Instead of directly building a large m×n pseudo-random H matrix, a structured LDPC design starts with a small $m_b \times n_b$ base matrix $H_b$, makes z copies of $H_b$, and interconnects the z copies to form a large m×n H matrix, where $m=m_b \times z$, $n=n_b \times z$. Using the matrix representation, to build H from $H_b$ each 1 in $H_b$ is replaced by a z×z permutation submatrix, and each 0 in $H_b$ is replaced by a z×z all-zero submatrix. It has been shown that the permutation can be very simple without compromising performance. For instance, a simple circular right shift, where the permutation submatrix is obtained by circularly right shifting the columns of an identity matrix by a given amount, can be used without degrading decoding performance. Since circular left shift (x mod z) times is equivalent to circular right shift ((z−x) mod z) times, this text only discusses circular right shift and refers to it as a circular shift for brevity. With this constraint, each H matrix can be uniquely represented by an $m_b \times n_b$ model matrix $H_{bm}$, which is obtained by replacing each $h_{ij}=0$ in $H_b$ by $p(i, j)=-1$ to denote a z×z all-zero matrix, and replacing each $h_{ij}=1$ in $H_b$ by a circular shift size $p(i, j) \geq 0$.

Thus instead of using the expanded matrix H, a code is uniquely defined by the model matrix $H_{bm}$. Both encoding and decoding can be performed based on a much smaller $m_b \times n_b$ $H_{bm}$ and vectors of bits, with each vector having size z.

This procedure essentially maps each edge of $H_b$ to a vector edge of size z in H (represented by $p(i, j)$ of $H_{bm}$), each variable node of $H_b$ to a vector variable node of length z in H (corresponding to a column of $H_{bm}$), and each check node of $H_b$ to a vector check node of length z in H (corresponding to a row of $H_{bm}$). In a structured design, the randomness is built in H through two stages: (a) the pseudo-random base matrix $H_b$; (b) the pseudo-random shift of the edges within each vector edge. Storage and processing complexity of a structured design are low because both stages of randomization are very simple.

Frequently a system such as that defined in the IEEE 802.16 standard is required to provide error-correcting codes for a family of codes of size $(n_f, k_f)$, where all the codes within the family have the same code rate $R=k_f/n_f$ and the code size scaled from a base size, $n_f=z_f \times n_b$, $k_f=z_f \times k_b$, $f=0, 1, \ldots, f_{max}$, where ($f_{max}$+1) is the total number of members in the code family, and $z_f$ is the expansion factor for the f-th code in the family. For these systems, it is possible to derive codes for all $(n_f, k_f)$ from one base matrix $H_b$ and a set of appropriate $z_f$. Let p(f, i, j) be the shift size of the vector edge located at position (i, j) within the f-th model matrix $H_{bm}$(f) of expansion factor $z_f$. Thus the set of shift sizes {p(f, i, j)} and the model matrix $H_{bm}$(f) can be referred to interchangeably.

However, it is not clear how to define shift sizes p(f, i, j) for each $H_{bm}$(f). One way to define a family of codes is to search for the base matrix $H_b$ and/or p(f, i, j), $0 \leq i \leq m-1$, $0 \leq j \leq n-1$, independently for all given f However, this approach requires that $H_b$ and/or p(f, i, j), $0 \leq i \leq m-1$, $0 \leq j \leq n-1$, be specified and stored for all f.

Since $H_b$ defines the basic structure and message interconnection of the LDPC decoder, it would be preferred to reuse $H_b$ for all codes in a family. When the same $H_b$ is shared by all codes in a family, Shift size p(f, i, j)=−1 when entry (i, j) of $H_b$ is 0. Shift size p(f, i, j)=−1 is used to denote a $z_f \times z_f$ all-zero submatrix that is used to replace entry (i, j) of model matrix $H_{bm}$(f) in expanding to the binary parity-check matrix H(f). If entry (i, j) of $H_b$ is 0, p(f, i, j) is the same for any f, i.e., p(f, i, j)=−1. Note that "−1" is only a label for the all-zero submatrix, and any other label that is not a non-negative integer can be used equivalently, e.g., "−2" or "∞".

Shift size p(f, i, j)$\geq$0 when entry (i, j) of $H_b$ is 1. Shift size p(f, i, j)$\geq$0 is used to denote a $z_f \times z_f$ identity submatrix circular right shifted by p(f, i, j) columns. The submatrix is used to replace entry (i, j) of model matrix $H_{bm}$(f) in expanding to the binary parity-check matrix H(f). The value of p(f, i, j) may be different for different f, i.e., entry (i, j) of $H_{bm}$(f) may be different for different f.

As to the value of non-negative p(f, i, j), it has been proposed to use p(f, i, j)=p(i, j) mod $z_f$ for any $z_f$, where the set of shift sizes {p(i, j)} is the same for all $z_f$. Thus only one set of {p(i, j)} needs to be specified, and it potentially reduces the complexity of implementing codes of different $z_f$. However, due to the effect of the modulo operation, a set of {p(i, j)} designed to avoid bad cycle patterns for one $z_f$ may cause a large number of cycles and low weight codewords for another $z_f$ resulting in degraded error-correcting performance for some $(n_f, k_f)$.

Therefore, there is a need for a method to derive shift sizes {p(f, i, j)} from one set of {p(i, j)} while maintaining the desired code properties for all code sizes $(n_f, k_f)$.

DETAILED DESCRIPTION OF THE DRAWINGS

To address the above-mentioned need, a base model matrix is defined for the largest code length of each code rate. The set of shifts {p(i, j)} in the base model matrix are used to determine the shift sizes for all other code lengths of the same code rate. Shift sizes {p(f, i, j)} for a code size corresponding to expansion factor $z_f$ are derived from {p(i, j)} by scaling p(i, j) proportionally, and a model matrix defined by {p(f, i, j)} is used to determine the parity-check bits for the f-th code.

The present invention encompasses a method for operating a transmitter that generates parity-check bits based on an information block. The method comprises the steps of defining a base model matrix having a set of shift sizes p(i, j) for a largest code length, and determining shift sizes p(f, i, j) for all other code lengths based on the set of shift sizes p(i, j), where f is an index of code lengths, p(f, i, j)=F(p(i, j), $z_0/z_f$), $z_0$ is an expansion factor of the largest code length, $z_f$ is an expansion factor of the f-th code length. An information block is received and a model matrix is used to determine parity-check bits. The model matrix is defined by p(f, i, j).

The present invention additionally encompasses an apparatus comprising storage means for storing a base model matrix having a set of shift sizes p(i, j) for a largest code length. The apparatus additionally comprises a microprocessor receiving an information block s=($s_0, \ldots, s_{k_f-1}$) and the base model matrix. The microprocessor determines shift sizes p(f, i, j) for all other code lengths based on the set of shift sizes p(i, j), where f is an index of code lengths, p(f, i, j)=F(p(i, j),$z_0/z_f$), $z_0$ is the expansion factor of a largest code length, $z_f$ is the expansion factor of the f-th code length. The microprocessor outputs parity-check bits based on a model matrix defined by p(f, i, j) and an information block s=($s_0, \ldots, s_{k_f-1}$)

The present invention additionally encompasses a method for operating a receiver that estimates an information block s=($s_0, \ldots, s_{k_f-1}$). The method comprises the steps of receiving a signal vector, defining a base model matrix having a set of shift sizes p(i, j) for a largest code length, and determining shift sizes p(f, i, j) for all other code lengths based on the set of shift sizes p(i, j), where f is an index of code lengths, p(f, i, j)=F(p(i, j),$z_0/z_f$), $z_0$ is the expansion factor of a largest code length, $z_f$ is the expansion factor of the f-th code length. The information block s=($s_0, \ldots, s_{k_f-1}$) is then estimated based on a model matrix defined by p(f, i, j) and the received signal vector.

Finally, the present invention encompasses an apparatus comprising storage means for storing a base model matrix having a set of shift sizes p(i, j) for a largest code length. The apparatus additionally comprises a decoder receiving a signal vector and determining shift sizes p(f, i, j) for all other code lengths based on the set of shift sizes p(i, j), where f is an index of code lengths, p(f, i, j)=F(p(i, j), $z_0/z_f$), $z_0$ is the expansion factor of a largest code length, $z_f$ is the expansion factor of the f-th code length. The decoder outputs an estimate for an information block s=($s_0, \ldots, s_{k_f-1}$) based on a model matrix defined by p(f, i, j) and the received signal vector.

It has been shown that the properties of an expanded matrix H are closely related to the properties of the base matrix $H_b$ and the shift sizes $p(i, j)$. Certain undesirable patterns of the shift sizes $p(i, j)$ would preserve the cycles and codeword patterns of $H_b$ and repeat them multiple times in the expanded matrix H due to the quasi-cyclic nature of the code design, leading to unacceptable error-correcting performance.

Since low weight codewords contain short cycles if $H_b$ does not have any weight-1 column, it is sufficient to make sure that short cycles are broken for all code sizes $(n_f, k_f)$ of interest in order to achieve good decoding performance.

It is found that a cycle of $H_b$ is duplicated in the expanded matrix if the following condition is satisfied.

If 2c edges form a cycle of length 2c in base matrix $H_b$, then the corresponding 2c vector edges form z cycles of length 2c in the expanded matrix H if and only if $$\sum_{\substack{i=2j \\ j=0,\ldots,c-1}} p(i) = \sum_{\substack{i=2j+1 \\ j=0,\ldots,c-1}} p(i) \pmod{z}, \quad p(i) \geq 0 \qquad (4)$$

where z is the expansion factor, $p(i)$ is the circular shift size of edge i in the model matrix $H_{bm}$, and edges 0, 1, 2, ..., 2c−1 (in this order) form a cycle in $H_b$.

While a fixed set of shift sizes $\{p(i, j)\}$ that avoids satisfying Equation (4) for one $z_f$ value may in fact satisfy Equation (4) for another $z_f$ value, the linearity of Equation (4) shows that one may avoid satisfying it for all $z_f$ if $\{p(i, j)\}$ scales in proportion to $z_f$.

Suppose one set of shift sizes $\{p(i, j)\}$ is to be used to expand a given base matrix $H_b$ for two expansion factors $z_0$ and $z_1$, $\alpha = z_0/z_1 > 1$. Assume that the shift size set $\{p(i, j)\} \equiv \{p(0, i, j)\}$ avoids cycles of length 2c for expansion factor $z_0$, $$\sum_{\substack{i=2j \\ j=0,\ldots,c-1}} p(i) \neq \sum_{\substack{i=2j+1 \\ j=0,\ldots,c-1}} p(i) \pmod{z_0}, \qquad (5)$$

then $$\sum_{\substack{i=2j \\ j=0,\ldots,c-1}} \frac{p(i)}{\alpha} \neq \sum_{\substack{i=2j+1 \\ j=0,\ldots,c-1}} \frac{p(i)}{\alpha} \pmod{z_1}, \qquad (6)$$

where $p(i)$ is the circular shift size of edge i in the model matrix $H_{bm}(0)$, and edges 0, 1, 2, ..., 2c−1 (in this order) form a cycle in $H_b$. Equation (6) indicates that if the set of scaled shift sizes $\{p(i, j)/\alpha\}$ are used for expansion factor $z_1$ then the H matrix expanded from $z_1$ would avoid the cycles of length 2c as well. Since 2c can be any cycle length, using the scaled shift sizes $\{p(i, j)/\alpha\}$ would avoid all cycle types for $z_1$ that are avoided by set $\{p(i, j)\}$ for $z_0$.

The discussions above ignored the limitation that the shift sizes after scaling still have to be integers. For example, either the flooring function $\lfloor x \rfloor$ (which is the largest integer smaller than or equal to x), the ceiling function $\lceil x \rceil$ (which is the smallest integer larger than or equal to x), or the rounding function [x] (which is the integer that differs from x the least), has to be performed on all $p(i, j)/\alpha$ to obtain an integer. In general, given the shift sizes $p(i, j) = p(0, i, j)$ for $z_0$, the shift sizes for $z_1$ can be derived as a function $F(.)$ of $p(i, j)$ and $\alpha$, $$p(1, i, j) = F(p(i, j), \alpha) = F(p(i, j), z_0/z_1). \qquad (7)$$

For example, if the rounding function is used on top of (6), and the shift sizes designed for $z_0$ is $p(i, j)$, then the set of shift sizes applied to $z_1$ is $$p(1, i, j) = \begin{cases} p(i, j), & p(i, j) \leq 0 \\ \left[\frac{p(i, j) z_1}{z_0}\right] = \left[\frac{p(i, j)}{\alpha}\right], & p(i, j) > 0 \end{cases} \qquad (8)$$

Although normally all positive $p(i, j)$ would be scaled, the scaling such as (8) may be applied to only a subset of $\{p(i, j)\}$. For example, those that are not involved in any cycles do not have to be scaled, e.g., the edges of the weight-1 columns of $H_b$ if they exist. Depending on the definition of the function $F(.)$ and if the scaling is applied to all non-negative $p(i, j)$, the base matrix of $H_{bm}(0)$ and $H_{bm}(1)$ may or may not be the same.

The analysis above is readily applied to finding $p(f, i, j)$ if the system needs more than two expansion factors. In this case, a mother model matrix (also called a base model matrix) $H_{bm}(0)$ having a set of shift sizes $p(0, i, j)$ for the largest code length is defined, from which the model matrix $H_{bm}(f)$ having shift sizes $p(f, i, j)$ for the f-th code family member is derived, $f=1, \ldots, f_{max}$. Assuming $z_0 = \max(z_f)$ and $p(0, i, j) = p(i, j)$, $\alpha_f = z_0/z_f$ should be used in expressions like (8) in deriving $p(f, i, j)$ from $p(i, j)$, so that the same cycles of the base matrix are avoided for the entire range of $z_f$. In particular, assuming all $p(i, j)$ are found, $$p(f, i, j) = F(p(i, j), \alpha_f) = F(p(i, j), z_0/z_f) \qquad (9)$$

in general is used to derive $p(f, i, j)$ from $p(i, j)$. Further, as an example, the function $F(.)$ may be defined as $$p(f, i, j) = \begin{cases} p(i, j), & p(i, j) \leq 0 \\ \left[\frac{p(i, j) z_1}{z_0}\right] = \left[\frac{p(i, j)}{\alpha_f}\right], & p(i, j) > 0 \end{cases} \qquad (10)$$

assming $z_0 = \max(z_f)$ and using the rounding function, corresponding to (8). Similarly, the flooring function $\lfloor x \rfloor$ or the ceiling function $\lceil x \rceil$ can be used in place of the rounding function [x].

Note that the design procedure above applies to any type of base matrix $H_b$. For example, it can be applied to an $H_b$ composed of two portions, $$H_b = [(H_{b1})_{m_b \times k_b} | (H_{b2})_{m_b \times m_b}], \qquad (11)$$

whose deterministic portion $H_{b2}$ can be further partitioned into two sections, where vector $h_b$ has odd weight $w_h > 2$, and $H'_{b2}$ has a deterministic staircase structure:

$$H_{b2} = [h_b | H'_{b2}] \qquad (12)$$

-continued $$= \begin{bmatrix} h_b(0) \\ h_b(1) \\ \cdot \\ \cdot \\ \cdot \\ h_b(m_b-1) \end{bmatrix} \begin{bmatrix} 1 & & & & \\ 1 & 1 & & 0 & \\ & 1 & \ddots & & \\ & & \ddots & 1 & \\ & 0 & & 1 & 1 \\ & & & & 1 \end{bmatrix}.$$

In other words, $H'_{b2}$ comprise matrix elements for row i, column j equal to $$H'_{b2}(i,j) = \begin{cases} 1, & i=j \text{ or } i=j+1; \\ 0, & \text{otherwise.} \end{cases}$$

Encoder Implementation for a Family of Codes

Since all members of the family designed above are derived from a mother model matrix $H_{bm} \equiv H_{bm}(0)$, thus all having the same structure, the encoding process for each member of the family is similar. A portion of or the entire model matrix could be stored and interpreted as instructions to a barrel shifter to perform circular shifts of the grouped information sequence.

Since all members of the family are derived from a mother model matrix $H_{bm} \equiv H_{bm}(0)$, the implementation of an encoder for the family only requires that the mother matrix be stored. Assuming the rounding function [x] is used, for the f-th member of the family, the circular shifts p(i, j) of the mother model matrix are replaced by circular shifts [p(i, j)/($z_0/z_f$)] for all p(i, j)>0, where $z_f$ indicates the expansion factor of the f-th member of the family that is being encoded. A straightforward implementation of this is to store the values $\alpha_f^{-1} = (z_0/z_f)^{-1}$ (or $\alpha_f = z_0/z_f$) for each member of the family in a read-only memory and compute the values [p(i, j)/($z_0/z_f$)], p(i, j)>0, on-the-fly using a multiplier. Alternatively, shift size sets {p(f, i, j)}, f=0, 1, . . . , $f_{max}$, for each member of the family may be precomputed using (8) (or more generally, (7)), and stored in the read-only memory.

The barrel shifter can be modified to provide circular shifts for all word sizes $z_f$ corresponding to the family members. Whereas this barrel shifter modification will complicate the barrel shifter logic and necessitate slower clock rates, an alternative requiring extra logic resources is to instantiate a different barrel shifter for each word size $z_f$.

Figure 2:
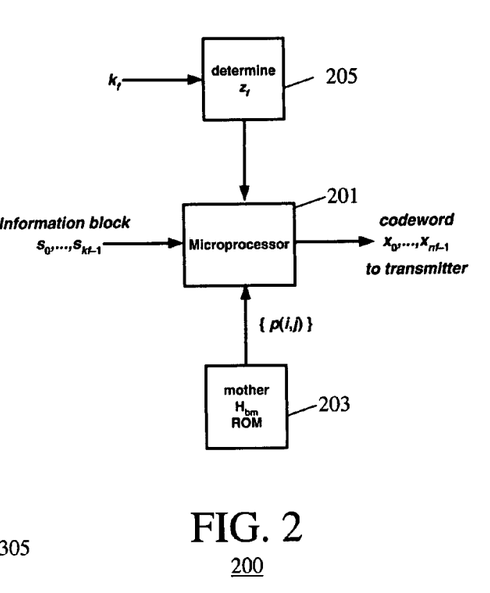
FIG. 2 is a block diagram of an encoder.

FIG. 2 is a block diagram of encoder 200. As shown, encoder 200 comprises microprocessor 201, lookup table 203, and logic circuitry 205 to determine an expansion factor $z_f$. Although shown existing external to one another, one of ordinary skill in the art will recognize that the functionality of logic circuitry 205 may be implemented within microprocessor 201. Microprocessor 201 preferably comprises a digital signal processor (DSP), such as, but not limited to MSC8300 and DSP56300 DSPs. Additionally, lookup table 203 serves as storage means to store a matrix, and comprises read-only memory; however, one of ordinary skill in the art will recognize that other forms of memory (e.g., random-access memory, magnetic storage memory, etc.) may be utilized as well. In a second embodiment, the functionality of the microprocessor 201, lookup table 203, and logic circuitry 205 can be incorporated into an application specific integrated circuit (ASIC) or field programmable gate array (FPGA). In particular, the lookup table 203 can be implemented in a form of memory corresponding to the existence or non-existence of signal paths in a circuit.

As discussed above, encoded data generally takes the form of a plurality of parity-check bits in addition to the systematic bits, where together the parity-check and systematic bits form a codeword x. In the first embodiment of the present invention, a base model matrix $H_{bm}$ is stored in lookup table 203, and is accessed by microprocessor 201 to find the parity-check bits. In particular, microprocessor 201 determines appropriate values for the parity-check bits $p=(p_0, \ldots, p_{mf-1})$ based on the information block $s=(s_0, \ldots, s_{kf-1})$, the expansion factor $z_f$, and the base model matrix $H_{bm}$. The expansion factor $z_f$ is determined by logic 205 using $z_f = k_f/k_b = n_f/n_b$, and is used to group bits into length-$z_f$ vectors as well as finding $\alpha_f = z_0/z_f$. After the parity-check bits are found, they and the systematic bits are then passed to a transmitter and transmitted to a receiver.

Figure 3:
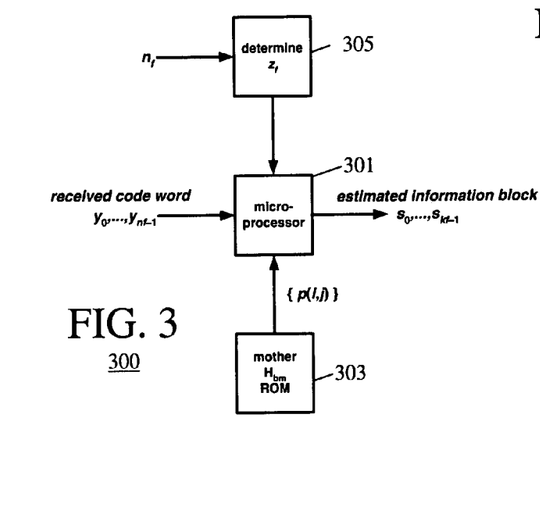
FIG. 3 is a block diagram of a decoder.

FIG. 3 is a block diagram of decoder 300 in accordance with one embodiment of the present invention. As shown, decoder 300 comprises microprocessor 301, lookup table 303, and logic circuitry 305 to determine an expansion factor $z_f$. In a first embodiment of the present invention, microprocessor 301 comprises a digital signal processor (DSP), such as, but not limited to MSC8300 and DSP56300 DSPs. Additionally, lookup table 303 acts as storage means for storing the base model matrix $H_{bm}$, and comprises read-only memory. However, one of ordinary skill in the art will recognize that other forms of memory (e.g., random-access memory, magnetic storage memory, etc.) may be utilized as well. In a second embodiment, the functionality of the microprocessor 301 and the lookup table 303 can be incorporated into an application specific integrated circuit (ASIC) or field programmable gate array (FPGA). In particular, the lookup table 303 can be implemented in a form of memory corresponding to the existence or non-existence of signal paths in a circuit.

The received signal vector (received via a receiver) $y=(y_0, \ldots, y_{nf-1})$ corresponds to the codeword x transmitted through a noisy channel, where the encoded data x, as discussed above, is a codeword vector of the f-th member of the code family. In the first embodiment of the present invention, a base model matrix $H_{bm}$ is stored in lookup table 303, and is accessed by microprocessor 301 to decode y and estimate the information block $s=(s_0, \ldots, s_{kf-1})$. In particular, microprocessor 301 estimates the information block $(s_0, \ldots, s_{kf-1})$ based on the received signal vector $y=(y_0, \ldots, y_{nf-1})$ and the base model matrix $H_{bm}$. The expansion factor $z_f$ is determined by logic 305 using $z_f = k_f/k_b = n_f/n_b$, and is used to group received signals and bits into length-$z_f$ vectors as well as finding $\alpha_f = z_0/z_f$.

Figure 4:
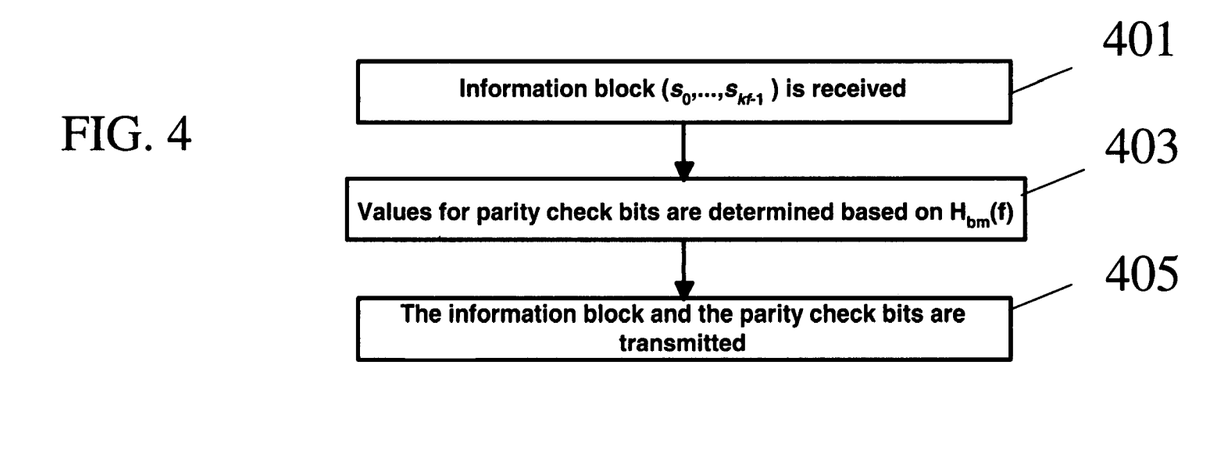
FIG. 4 is a flow chart showing the operation of the encoder of FIG. 2.

FIG. 4 is a flow chart showing the operation of encoder 200, and in particular, microprocessor 201. The logic flow begins at step 401 where an information block $(s_0, \ldots, s_{kf-1})$ is received by microprocessor 201. At step 403, values of parity-check bits are determined based on the information block and $H_{bm}(f)$, where $H_{bm}(f)$ is uniquely defined by {p(f, i, j)}. In particular, the shift size set {p(i, j)} of the base model matrix $H_{bm}$ is read out from memory. The microprocessor utilizes {p(i, j)} and $\alpha_f$ to determine {p(f, i, j)}. The parity-check bits $(p_0, \ldots, p_{mf-1})$ are determined by solving Equation (1). At step 405 the information block and the parity-check bits are transmitted through a channel.

Figure 5:
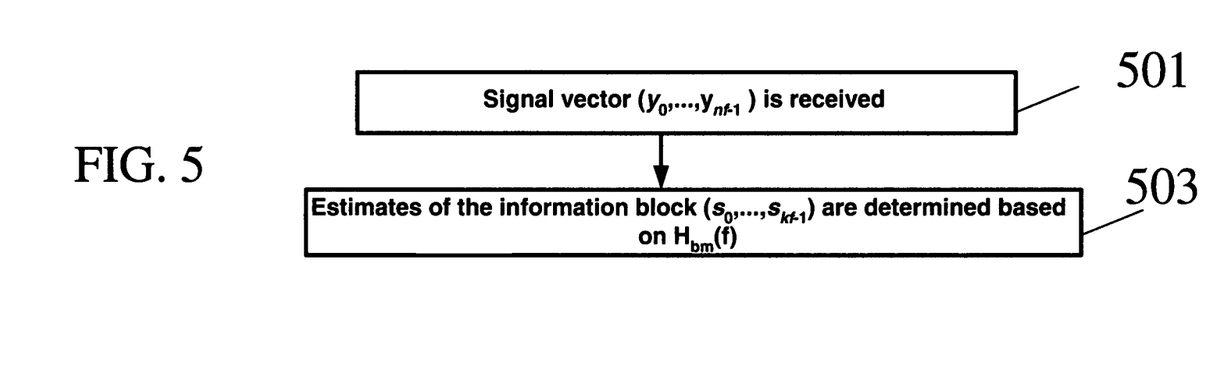
FIG. 5 is a flow chart showing the operation of the decoder of FIG. 3.

FIG. 5 is a flow chart showing the operation of decoder 300, and in particular, microprocessor 301. The logic flow begins at step 501 where the received signal vector $y=(y_0, \ldots, y_{nf-1})$ is received. At step 503, estimates of the information block $s=(s_0, \ldots, s_{kf-1})$ are determined based on $H_{bm}(f)$, where $H_{bm}(f)$ is uniquely defined by {p(f, i,j)}. In particular, the shift size set {p(i, j)} of the base model matrix $H_{bm}$ is read out from memory. The microprocessor utilizes {p(i, j)} and $\alpha_f$ to determine {p(f, i, j)}. As discussed, the microprocessor processes the received signal vector in accordance with the shift sizes {p(f, i, j)} (or equivalently, $H_{bm}(f)$) to obtain estimates of the information block. In a preferred embodiment, the microprocessor performs the processing according to a message-passing algorithm using the bipartite graph of the code.

EXAMPLES

As an example, code design for 19 code sizes $n_f$ in the range of 576 to 2304 bits is described. Each base model matrix is designed for a shift size $z_0$=96. A set of shift sizes $\{p(i, j)\}$ is defined for the base model matrix and used for other code sizes of the same rate. For other code sizes, the shift sizes are derived from the base model matrix as follows:

For a code size corresponding to expansion factor $z_f$, its shift sizes $\{p(f, i, j)\}$ are derived from $\{p(i, j)\}$ by scaling $p(i, j)$ proportionally, $$p(f, i, j) = \begin{cases} p(i, j), & p(i, j) \leq 0 \\ \left\lfloor \dfrac{p(i, j) z_f}{z_0} \right\rfloor = \left\lfloor \dfrac{p(i, j)}{\alpha_f} \right\rfloor, & p(i, j) > 0 \end{cases}.$$

Note that $\alpha_f = z_0/z_f$ and $\lfloor x \rfloor$ denotes the flooring function which gives the nearest integer towards $-\infty$.

The base model matrices are tabulated below for three code rates of ½, ⅔ and ¾. Here f is the index of the code lengths for a given code rate, f=0, 1, 2, . . . 18.

Rate ½:

The base model matrix has size $n_b$=24, $m_b$=12 and an expansion factor $z_0$=96 (i.e., $n_0$=24*96=2304). To achieve other code sizes $n_f$, the expansion factor $z_f$ is equal to $n_f/24$.

```
-1  94  73  -1  -1  -1  -1  -1  55  83  -1  -1   7   0  -1  -1  -1  -1  -1  -1  -1  -1  -1  -1
-1  27  -1  -1  -1  22  79   9  -1  -1  -1  12  -1   0   0  -1  -1  -1  -1  -1  -1  -1  -1  -1
-1  -1  -1  24  22  81  -1  33  -1  -1  -1   0  -1  -1   0   0  -1  -1  -1  -1  -1  -1  -1  -1
61  -1  47  -1  -1  -1  -1  -1  65  25  -1  -1  -1  -1   0   0  -1  -1  -1  -1  -1  -1  -1  -1
-1  -1  39  -1  -1  -1  84  -1  -1  41  72  -1  -1  -1  -1  -1   0   0  -1  -1  -1  -1  -1  -1
-1  -1  -1  -1  46  40  -1  82  -1  -1  -1  79   0  -1  -1  -1  -1   0   0  -1  -1  -1  -1  -1
-1  -1  95  53  -1  -1  -1  -1  14  18  -1  -1  -1  -1  -1  -1  -1  -1   0   0  -1  -1  -1  -1
-1  11  73  -1  -1  -1   2  -1  -1  47  -1  -1  -1  -1  -1  -1  -1  -1  -1   0   0  -1  -1  -1
12  -1  -1  -1  83  24  -1  43  -1  -1  -1  51  -1  -1  -1  -1  -1  -1  -1  -1   0   0  -1  -1
-1  -1  -1  -1  -1  94  -1  59  -1  -1  70  72  -1  -1  -1  -1  -1  -1  -1  -1  -1   0   0  -1
-1  -1   7  65  -1  -1  -1  -1  39  49  -1  -1  -1  -1  -1  -1  -1  -1  -1  -1  -1  -1   0   0
43  -1  -1  -1  -1  66  -1  41  -1  -1  -1  26   7  -1  -1  -1  -1  -1  -1  -1  -1  -1  -1   0
```

Rate ⅔:

The base model matrix has size $n_b$=24, $m_b$=8 and an expansion factor $z_0$=96 (i.e., $n_0$=24*96=2304). To achieve other code sizes $n_f$, the expansion factor $z_f$ is equal to $n_f/24$.

```
56  -1  -1  54  -1  75  -1  82  93  -1  -1  49  -1   3  83  -1   7   0  -1  -1  -1  -1  -1  -1
-1  47  36  -1  -1   4  62  -1  14  -1  -1  37  63  -1  -1  11  -1   0   0  -1  -1  -1  -1  -1
-1  61  -1  37  -1  -1  84  -1  54  -1   2  93  -1  23  -1  79   0  -1   0   0  -1  -1  -1  -1
84  -1  -1  77  -1  80  -1  31  78  -1   9  -1  65  -1  -1  58  -1  -1  -1   0   0  -1  -1  -1
-1  55  40  -1   8  -1  13  -1  -1  79  60  -1  95  -1  -1  30  -1  -1  -1  -1   0   0  -1  -1
11  -1  -1  45   0  -1  -1  10  -1  13  21  -1  -1  70  86  -1  -1  -1  -1  -1  -1   0   0  -1
35  -1   6  -1  16  40  -1  30  -1  57  -1  -1  89  -1  74  -1  -1  -1  -1  -1  -1  -1   0   0
-1  89  95  -1  77  -1  56  -1  -1  74  -1  14  -1  78  14  -1   7  -1  -1  -1  -1  -1  -1   0
```

Rate ¾:

The base matrix has size $n_b$=24, $m_b$=6 and an expansion factor $z_0$=96 (i.e., $n_0$=24*96=2304). To achieve other code sizes $n_f$, the expansion factor $z_f$ is equal to $n_f/24$.

```
43  90  41  40  19  -1  -1  -1  -1  86  -1  83  26  74  50  -1  -1  62   7   0  -1  -1  -1  -1
-1  -1  95  61  84   2  16  -1  -1   0  -1  -1  -1  20  30  91  18  95  -1   0   0  -1  -1  -1
-1  -1  -1  87   0  -1  58  16  -1  87  16  -1  -1  93  -1  54  24  33   0  -1   0   0  -1  -1
-1  12  -1  -1  65  48  -1  10  10  95  -1  49  -1  52   6  -1  36  57  -1  -1  -1   0   0  -1
65  -1  31  -1  15  -1  12  -1   6  57   0  89   9  29  -1  -1  -1  75  -1  -1  -1  -1   0   0
-1  65  -1  -1  48  40  -1  83  18  45  29  -1  73  84  -1  77  -1  95   7  -1  -1  -1  -1   0
```

While the invention has been particularly shown and described with reference to a particular embodiment, it will be understood by those skilled in the art that various changes in form and details may be made therein without departing from the spirit and scope of the invention. For example, when the code size range is very large, e.g., α approaches z/2, it would become very difficult to find the proper shift size set $\{p(i, j)\}$. Therefore if the code size range is too large, i.e., α is large, one may use multiple sets of $\{p(i, j)\}$, each covering a range of $z_f$ for the code family. In another example, although the discussion assumed that the mother model matrix $H_{bm}(0)$, $z_0$=max($z_f$), and p(0, i, j)=p(i, j) are used for the 0-th code family member, those skilled in the art would understand that $H_{bm}(0)$, $z_0$, and p(i, j) may be defined for a code size not in the code family, but are used to derive the shift sizes p(f, i, j) for the code family of interest. In another example, although the discussion assumed that $z_0$=max($z_f$), those skilled in the art would understand that a $z_0$ value not equal to max($z_f$) may be used in shift size derivations. It is intended that such changes come within the scope of the following claims.

The invention claimed is:

1. A method for operating a transmitter that generates parity-check bits based on an information block, the method comprising the steps of:
defining a base model matrix having a set of shift sizes p(i,j) for a largest code length;
determining shift sizes p(f,i,j) for all other code lengths based on the set of shift sizes p(i,j), where f is an index of code lengths, p(f, i, j)=F(p(i, j), $z_0/z_f$), $z_0$ is an expansion factor of the largest code length, $z_f$ is an expansion factor of the f-th code length;
receiving the information block s=($s_0$, . . . , $s_{k_f-1}$);
using a model matrix defined by p(f,i,j) to determine the parity-check bits; and
transmitting the parity-check bits along with the information block, wherein $$\{p(i,j)\} = \begin{matrix} -1 & 94 & 73 & -1 & -1 & -1 & -1 & -1 & 55 & 83 & -1 & -1 \\ -1 & 27 & -1 & -1 & -1 & 22 & 79 & 9 & -1 & -1 & -1 & 12 \\ -1 & -1 & -1 & 24 & 22 & 81 & -1 & 33 & -1 & -1 & -1 & 0 \\ 61 & -1 & 47 & -1 & -1 & -1 & -1 & 65 & 25 & -1 & -1 \\ -1 & -1 & 39 & -1 & -1 & -1 & 84 & -1 & -1 & 41 & 72 & -1 \\ -1 & -1 & -1 & -1 & 46 & 40 & -1 & 82 & -1 & -1 & -1 & 79 \\ -1 & -1 & 95 & 53 & -1 & -1 & -1 & -1 & -1 & 14 & 18 & -1 \\ -1 & 11 & 73 & -1 & -1 & -1 & 2 & -1 & -1 & 47 & -1 & -1 \\ 12 & -1 & -1 & -1 & 83 & 24 & -1 & 43 & -1 & -1 & -1 & 51 \\ -1 & -1 & -1 & -1 & -1 & 94 & -1 & 59 & -1 & -1 & 70 & 72 \\ -1 & -1 & 7 & 65 & -1 & -1 & -1 & -1 & 39 & 49 & -1 & -1 \\ 43 & -1 & -1 & -1 & -1 & 66 & -1 & 41 & -1 & -1 & -1 & 26 \end{matrix}$$

$$\begin{matrix} 7 & 0 & -1 & -1 & -1 & -1 & -1 & -1 & -1 & -1 & -1 & -1 \\ -1 & 0 & 0 & -1 & -1 & -1 & -1 & -1 & -1 & -1 & -1 & -1 \\ -1 & -1 & 0 & 0 & -1 & -1 & -1 & -1 & -1 & -1 & -1 & -1 \\ -1 & -1 & -1 & 0 & 0 & -1 & -1 & -1 & -1 & -1 & -1 & -1 \\ -1 & -1 & -1 & -1 & 0 & 0 & -1 & -1 & -1 & -1 & -1 & -1 \\ 0 & -1 & -1 & -1 & -1 & 0 & 0 & -1 & -1 & -1 & -1 & -1 \\ -1 & -1 & -1 & -1 & -1 & -1 & 0 & 0 & -1 & -1 & -1 & -1 \\ -1 & -1 & -1 & -1 & -1 & -1 & -1 & 0 & 0 & -1 & -1 & -1 \\ -1 & -1 & -1 & -1 & -1 & -1 & -1 & -1 & 0 & 0 & -1 & -1 \\ -1 & -1 & -1 & -1 & -1 & -1 & -1 & -1 & -1 & 0 & 0 & -1 \\ -1 & -1 & -1 & -1 & -1 & -1 & -1 & -1 & -1 & -1 & 0 & 0 \\ 7 & -1 & -1 & -1 & -1 & -1 & -1 & -1 & -1 & -1 & -1 & 0 \end{matrix}$$

2. The method of claim 1 wherein:

$$p(f, i, j) = \begin{cases} p(i, j), & p(i, j) \leq 0 \\ \left\lfloor \frac{p(i, j)z_f}{z_0} \right\rfloor, & p(i, j) > 0 \end{cases},$$

and $\lfloor x \rfloor$ denotes the flooring function.

3. The method of claim 1 wherein $$p(f, i, j) = F\left(p(i, j), \frac{z_0}{z_f}\right) = \begin{cases} p(i, j), & p(i, j) \leq 0 \\ \left[ \frac{p(i, j)z_f}{z_0} \right], & p(i, j) > 0 \end{cases}$$

and [x] denotes the rounding function.

4. The method of claim 1 wherein $$p(f, i, j) = F\left(p(i, j), \frac{z_0}{z_f}\right) = \begin{cases} p(i, j), & p(i, j) \leq 0 \\ \left\lceil \frac{p(i, j)z_f}{z_0} \right\rceil, & p(i, j) > 0 \end{cases}$$

and $\lceil x \rceil$ denotes the ceiling function.

5. The method of claim 1 where the parity-check bits are found based on a parity-check matrix H(f) which is expanded from a model matrix $H_{bm}(f)$ defined by p(f,i,j) with expansion factor $z_f$.

6. The method of claim 5 wherein the parity-check matrix H(f) is expanded by replacing each negative element of $H_{bm}(f)$ with a zero submatrix of size z×z to produce H(f).

7. The method of claim 5 wherein H(f) is expanded by replacing each non-negative element of $H_{bm}(f)$ with a non-zero permutation submatrix to produce H.

8. The method of claim 5 wherein $H_{bm}(f)$ and $H_{bm}(0)$ use a same base matrix $H_b$.

9. The method of claim 5 wherein $H_{bm}(f)$ and $H_{bm}(0)$ use different base matrices.

10. The method of claim 1 wherein the base model matrix is built from a base matrix comprising a section $H_{b1}$ and a section $H_{b2}$, with $H_{b2}$ comprising a first part having a column $h_b$ having an odd weight greater than 2, and a second part $H'_{b2}$ comprising matrix elements for row i, column j equal to 1 for i=j,
1 for i=j+1,
0 elsewhere.

11. An apparatus comprising:
storage means for storing a base model matrix having a set of shift sizes p(i,j) for a largest code length; and a microprocessor receiving an information block s=$(s_0, \ldots, s_{k_f-1})$ and the base model matrix and determining shift sizes p(f,i,j) for all other code lengths based on the set of shift sizes p(i,j), where f is an index of code lengths, p(f, i,j)=F(p(i, j), $z_0/z_f$), $z_0$ is the expansion factor of a largest code length, $z_f$ is the expansion factor of the f-th code length; the microprocessor outputting parity-check bits based on a model matrix defined by p(f,i,j) and an information block s=$(s_0, \ldots, s_{k_f-1})$; wherein $$\{p(i,j)\} = \begin{matrix} -1 & 94 & 73 & -1 & -1 & -1 & -1 & -1 & 55 & 83 & -1 & -1 \\ -1 & 27 & -1 & -1 & -1 & 22 & 79 & 9 & -1 & -1 & -1 & 12 \\ -1 & -1 & -1 & 24 & 22 & 81 & -1 & 33 & -1 & -1 & -1 & 0 \\ 61 & -1 & 47 & -1 & -1 & -1 & -1 & -1 & 65 & 25 & -1 & -1 \\ -1 & -1 & 39 & -1 & -1 & -1 & 84 & -1 & -1 & 41 & 72 & -1 \\ -1 & -1 & -1 & -1 & 46 & 40 & -1 & 82 & -1 & -1 & -1 & 79 \\ -1 & -1 & 95 & 53 & -1 & -1 & -1 & -1 & -1 & 14 & 18 & -1 \\ -1 & 11 & 73 & -1 & -1 & -1 & 2 & -1 & -1 & 47 & -1 & -1 \\ 12 & -1 & -1 & -1 & 83 & 24 & -1 & 43 & -1 & -1 & -1 & 51 \\ -1 & -1 & -1 & -1 & -1 & 94 & -1 & 59 & -1 & -1 & 70 & 72 \\ -1 & -1 & 7 & 65 & -1 & -1 & -1 & -1 & 39 & 49 & -1 & -1 \\ 43 & -1 & -1 & -1 & -1 & 66 & -1 & 41 & -1 & -1 & -1 & 26 \end{matrix}$$

$$\begin{matrix} 7 & 0 & -1 & -1 & -1 & -1 & -1 & -1 & -1 & -1 & -1 & -1 \\ -1 & 0 & 0 & -1 & -1 & -1 & -1 & -1 & -1 & -1 & -1 & -1 \\ -1 & -1 & 0 & 0 & -1 & -1 & -1 & -1 & -1 & -1 & -1 & -1 \\ -1 & -1 & -1 & 0 & 0 & -1 & -1 & -1 & -1 & -1 & -1 & -1 \\ -1 & -1 & -1 & -1 & 0 & 0 & -1 & -1 & -1 & -1 & -1 & -1 \\ 0 & -1 & -1 & -1 & -1 & 0 & 0 & -1 & -1 & -1 & -1 & -1 \\ -1 & -1 & -1 & -1 & -1 & -1 & 0 & 0 & -1 & -1 & -1 & -1 \\ -1 & -1 & -1 & -1 & -1 & -1 & -1 & 0 & 0 & -1 & -1 & -1 \\ -1 & -1 & -1 & -1 & -1 & -1 & -1 & -1 & 0 & 0 & -1 & -1 \\ -1 & -1 & -1 & -1 & -1 & -1 & -1 & -1 & -1 & 0 & 0 & -1 \\ -1 & -1 & -1 & -1 & -1 & -1 & -1 & -1 & -1 & -1 & 0 & 0 \\ 7 & -1 & -1 & -1 & -1 & -1 & -1 & -1 & -1 & -1 & -1 & 0 \end{matrix}.$$

12. The apparatus of claim 11 wherein:

$$p(f, i, j) = \begin{cases} p(i, j), & p(i, j) \leq 0 \\ \left\lfloor \frac{p(i, j) z_f}{z_0} \right\rfloor, & p(i, j) > 0 \end{cases},$$

wherein $\lfloor x \rfloor$ denotes the flooring function.

13. The apparatus of claim 11 further comprising a read-only memory having values for p(f,i, j)=F(p(i, j), $z_0/z_f$).

14. The apparatus of claim 11 further comprising a read-only memory having values for $z_0/z_f$.

15. A method for operating a receiver that estimates an information block s=$(s_0, \ldots, s_{k_f-1})$, the method comprising the steps of:

receiving a signal vector;

defining a base model matrix having a set of shift sizes p(i,j) for a largest code length;

determining shift sizes p(f,i,j) for all other code lengths based on the set of shift sizes p(i, j), where f is an index of code lengths, p(f,i,j)=F(p(i, j), $z_0/z_f$), $z_0$ is the expansion factor of a largest code length, $z_f$ is the expansion factor of the f-th code length; and estimating the information block s=$(s_0, \ldots, s_{k_f-1})$ based on a model matrix defined by p(f,i,j) and the received signal vector, wherein $$\{p(i,j)\} = \begin{matrix} -1 & 94 & 73 & -1 & -1 & -1 & -1 & -1 & 55 & 83 & -1 & -1 \\ -1 & 27 & -1 & -1 & -1 & 22 & 79 & 9 & -1 & -1 & -1 & 12 \\ -1 & -1 & -1 & 24 & 22 & 81 & -1 & 33 & -1 & -1 & -1 & 0 \\ 61 & -1 & 47 & -1 & -1 & -1 & -1 & -1 & 65 & 25 & -1 & -1 \\ -1 & -1 & 39 & -1 & -1 & -1 & 84 & -1 & -1 & 41 & 72 & -1 \\ -1 & -1 & -1 & -1 & 46 & 40 & -1 & 82 & -1 & -1 & -1 & 79 \\ -1 & -1 & 95 & 53 & -1 & -1 & -1 & -1 & -1 & 14 & 18 & -1 \\ -1 & 11 & 73 & -1 & -1 & -1 & 2 & -1 & -1 & 47 & -1 & -1 \\ 12 & -1 & -1 & -1 & 83 & 24 & -1 & 43 & -1 & -1 & -1 & 51 \\ -1 & -1 & -1 & -1 & -1 & 94 & -1 & 59 & -1 & -1 & 70 & 72 \\ -1 & -1 & 7 & 65 & -1 & -1 & -1 & -1 & 39 & 49 & -1 & -1 \\ 43 & -1 & -1 & -1 & -1 & 66 & -1 & 41 & -1 & -1 & -1 & 26 \end{matrix}$$

$$\begin{matrix} 7 & 0 & -1 & -1 & -1 & -1 & -1 & -1 & -1 & -1 & -1 & -1 \\ -1 & 0 & 0 & -1 & -1 & -1 & -1 & -1 & -1 & -1 & -1 & -1 \\ -1 & -1 & 0 & 0 & -1 & -1 & -1 & -1 & -1 & -1 & -1 & -1 \\ -1 & -1 & -1 & 0 & 0 & -1 & -1 & -1 & -1 & -1 & -1 & -1 \\ -1 & -1 & -1 & -1 & 0 & 0 & -1 & -1 & -1 & -1 & -1 & -1 \\ 0 & -1 & -1 & -1 & 0 & 0 & -1 & -1 & -1 & -1 & -1 & -1 \\ -1 & -1 & -1 & -1 & -1 & 0 & 0 & -1 & -1 & -1 & -1 & -1 \\ -1 & -1 & -1 & -1 & -1 & -1 & 0 & 0 & -1 & -1 & -1 & -1 \\ -1 & -1 & -1 & -1 & -1 & -1 & -1 & 0 & 0 & -1 & -1 & -1 \\ -1 & -1 & -1 & -1 & -1 & -1 & -1 & -1 & 0 & 0 & -1 & -1 \\ -1 & -1 & -1 & -1 & -1 & -1 & -1 & -1 & -1 & 0 & 0 & -1 \\ -1 & -1 & -1 & -1 & -1 & -1 & -1 & -1 & -1 & -1 & 0 & 0 \\ 7 & -1 & -1 & -1 & -1 & -1 & -1 & -1 & -1 & -1 & -1 & 0 \end{matrix}.$$

16. The method of claim 15 wherein:

$$p(f, i, j) = \begin{cases} p(i, j), & p(i, j) \leq 0 \\ \left\lfloor \frac{p(i, j) z_f}{z_0} \right\rfloor, & p(i, j) > 0 \end{cases},$$

and $\lfloor x \rfloor$ denotes the flooring function.

17. An apparatus comprising:

storage means for storing a base model matrix having a set of shift sizes p(i,j) for a largest code length; and a decoder receiving a signal vector and determining shift sizes p(f,i,j) for all other code lengths based on the set of shift sizes p(i,j), where f is an index of code lengths, p(f,i, j)=F(p(i, j),$z_0/z_f$), $z_0$ is the expansion factor of a largest code length, $z_f$ is the expansion factor of the f-th code length; the decoder outputting an estimate for an information block s=$(s_0, \ldots, s_{k_f-1})$ based on a model matrix defined by p(f,i,j) and the received signal vector, wherein $$\{p(i,j)\} = \begin{pmatrix} -1 & 94 & 73 & -1 & -1 & -1 & -1 & -1 & 55 & 83 & -1 & -1 & 7 & 0 & -1 & -1 & -1 & -1 & -1 & -1 & -1 & -1 & -1 \\ -1 & 27 & -1 & -1 & -1 & 22 & 79 & 9 & -1 & -1 & -1 & 12 & -1 & 0 & 0 & -1 & -1 & -1 & -1 & -1 & -1 & -1 & -1 \\ -1 & -1 & -1 & 24 & 22 & 81 & -1 & 33 & -1 & -1 & -1 & 0 & -1 & -1 & 0 & 0 & -1 & -1 & -1 & -1 & -1 & -1 & -1 \\ 61 & -1 & 47 & -1 & -1 & -1 & -1 & -1 & 65 & 25 & -1 & -1 & -1 & -1 & -1 & 0 & 0 & -1 & -1 & -1 & -1 & -1 & -1 \\ -1 & -1 & 39 & -1 & -1 & -1 & 84 & -1 & -1 & 41 & 72 & -1 & -1 & -1 & -1 & -1 & 0 & 0 & -1 & -1 & -1 & -1 & -1 \\ -1 & -1 & -1 & -1 & 46 & 40 & -1 & 82 & -1 & -1 & -1 & 79 & 0 & -1 & -1 & -1 & -1 & 0 & 0 & -1 & -1 & -1 & -1 \\ -1 & -1 & 95 & 53 & -1 & -1 & -1 & -1 & -1 & 14 & 18 & -1 & -1 & -1 & -1 & -1 & -1 & 0 & 0 & -1 & -1 & -1 & -1 \\ -1 & 11 & 73 & -1 & -1 & -1 & 2 & -1 & -1 & 47 & -1 & -1 & -1 & -1 & -1 & -1 & -1 & -1 & 0 & 0 & -1 & -1 & -1 \\ 12 & -1 & -1 & -1 & 83 & 24 & -1 & 43 & -1 & -1 & -1 & 51 & -1 & -1 & -1 & -1 & -1 & -1 & -1 & 0 & 0 & -1 & -1 \\ -1 & -1 & -1 & -1 & -1 & 94 & -1 & 59 & -1 & -1 & 70 & 72 & -1 & -1 & -1 & -1 & -1 & -1 & -1 & -1 & 0 & 0 & -1 \\ -1 & -1 & 7 & 65 & -1 & -1 & -1 & -1 & 39 & 49 & -1 & -1 & -1 & -1 & -1 & -1 & -1 & -1 & -1 & -1 & -1 & 0 & 0 \\ 43 & -1 & -1 & -1 & -1 & 66 & -1 & 41 & -1 & -1 & -1 & 26 & 7 & -1 & -1 & -1 & -1 & -1 & -1 & -1 & -1 & -1 & 0 \end{pmatrix}.$$

18. The method of claim 17 wherein:

$$p(f,i,j) = \begin{cases} p(i,j), & p(i,j) \le 0 \\ \left\lfloor \dfrac{p(i,j)z_f}{z_0} \right\rfloor, & p(i,j) > 0 \end{cases},$$

and $\lfloor x \rfloor$ denotes the flooring function.

\* \* \* \* \*